US005812677A

United States Patent [19]

Tamaru

[11] Patent Number: 5,812,677

[45] Date of Patent: Sep. 22, 1998

[54] ACOUSTIC SIGNAL PROCESSING METHOD AND APPARATUS

[75] Inventor: Yoshihiko Tamaru, Kanagawa, Japan

[73] Assignee: Sony Corporation, Tokyo, Japan

[21] Appl. No.: 576,301

[22] Filed: Dec. 21, 1995

[30] Foreign Application Priority Data

Dec. 21, 1994 [JP] Japan .................................... 6-318503

[51] Int. Cl.[6] ........................................................ H03G 3/00

[52] U.S. Cl. ................................ 381/61; 381/1; 381/118; 364/724.13; 364/724.16

[58] Field of Search ................................. 381/61, 63, 62, 381/1, 118; 364/724.13, 724.16

[56] References Cited

U.S. PATENT DOCUMENTS 3,717,754 2/1973 Buzzard et al. .
5,034,909 7/1991 Hartley .

*Primary Examiner*—Forester W. Isen
*Attorney, Agent, or Firm*—Hill, Steadman & Simpson

[57] ABSTRACT

Main voice processing is performed on an acoustic signal at a basic sampling frequency fs within one period of the basic sampling frequency fs to allow the main voice processing implemented acoustic signal to undergo down-sampling for implementing voice processing for acoustic effect to the acoustic signal at another sampling frequency ½ fs or one half the basic sampling frequency to allow the acoustic signal which has been subjected to voice processing for acoustic effect to undergo up-sampling and thus to continuously carry out the main voice processing by the basic sampling frequency fs and the voice processing for acoustic effect by another sampling frequency ½ fs.

12 Claims, 4 Drawing Sheets

Time chart showing operation at 1fs and $\frac{1}{2}$ fs time intervals of embodiment of acoustic signal processing method and apparatus of this invention Block diagram showing configuration of embodiment of apparatus to which acoustic signal processing method of this invention is applied Time chart showing operation at 1fs time interval of embodiment of acoustic signal processing method and apparatus of this invention Time chart showing operation at 1fs and $\frac{1}{2}$ fs time intervals of embodiment of acoustic signal processing method and apparatus of this invention

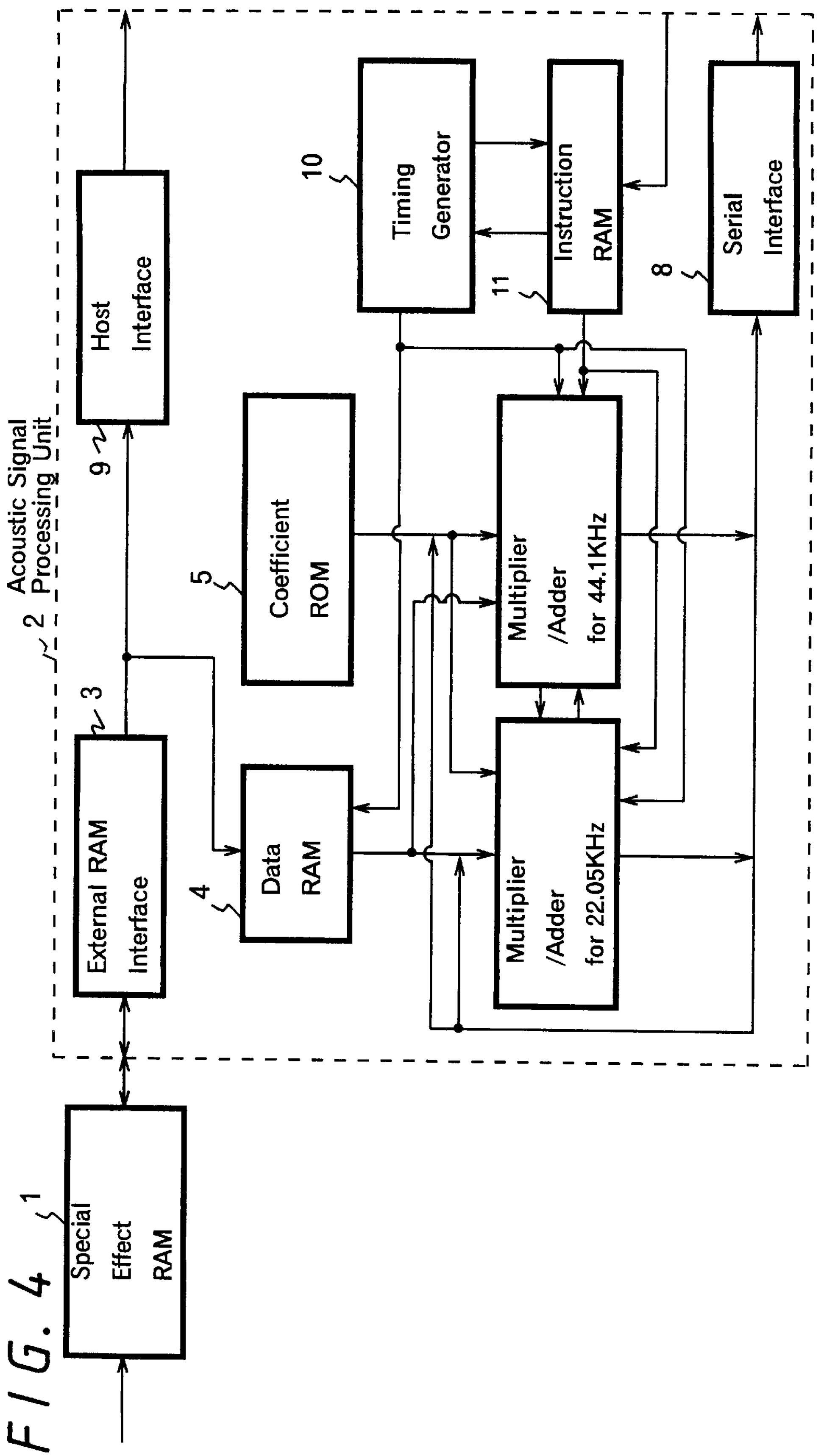
Block diagram of conventional acoustic signal processing apparatus using two sampling frequencies

ACOUSTIC SIGNAL PROCESSING METHOD AND APPARATUS

BACKGROUND OF THE INVENTION

1. Field of the Invention

The present invention relates generally to an acoustic signal processing method and apparatus, and, more particularly, the present invention relates to an acoustic signal processing method and apparatus wherein a primary audio signal and special effect signal are processed during a single sampling period at different sampling rates.

2. Description of the Prior Art

In known systems for processing acoustic signals contained on a CD (Compact Disc), in order to carry out digital processing of signals, sampling is carried out at a sampling frequency of 44.1 kHz. This sampling frequency is the number of sampling operations which take place in one second for accurate digital storage and reproduction of an analog waveform. The value which is 1/2.2 times the sampling frequency is the upper limit of the frequency range where reproduction can be accurately provided. Because the desired reproduction band frequency of 20 kHz is required for high fidelity reproduction and the sampling frequency of PCM processor using a VTR as recording medium was 44.1 kHz, the same sampling frequency was employed for optical disc technology in order to make the best use of these practical requirements.

However, because the clock frequency for the operating processor for processing of acoustic signals and/or the IC for the related peripherals thereof is lower than the above-mentioned sampling frequency, there were instances where the wait time for signal processing after a special effect has been performed on an acoustic signal by an external special effect RAM is increased. Furthermore, when the sampling frequency is high, the number of sampling operations increases, and the number of data samples increases accordingly. For this reason, the memory capacity of the external special effect RAM had to be increased.

An improvement was made such that a plurality of sampling frequencies for processing of acoustic signals are used depending upon the particular type of operation instead of a single sampling frequency. A block diagram of a conventional acoustic signal processing apparatus using two sampling frequencies is shown in FIG. 4.

In FIG. 4, an acoustic signal is delivered to an external special effect RAM 1. The acoustic signal on which special effects processing has been implemented by the special effect RAM 1 is delivered to an external RAM interface 3 within an acoustic signal processing unit (apparatus) 2. The special effect RAM 1 and the acoustic signal processing unit 2 are connected through the external RAM interface 3. The acoustic signal delivered to the external RAM interface 3 is delivered to a data RAM 4. The data RAM 4 provides predetermined data for signal processing to a multiplier/adder 41 for 44.1 kHz sampling and a multiplier/adder 40 for 22.05 kHz sampling on the basis of the acoustic signal delivered thereto. At this time, a coefficient ROM 5 also delivers predetermined data to the multiplier/adder 41 for 44.1 kHz sampling and the multiplier/adder 40 for 22.05 kHz sampling. The multiplier/adder 41 for 44.1 kHz sampling and the multiplier/adder 40 for 22.05 kHz sampling mutually deliver data to the other (operation section) units to perform their respective operations. Acoustic signal components which have undergone signal processing by the multiplier/adder 41 for 44.1 kHz processing and the multiplier/adder 40 for 22.05 kHz processing are delivered to a serial interface 8. The serial interface 8 delivers the acoustic signal which has undergone signal processing to the external devices for reproduction. In addition, a host interface 9 delivers the acoustic signal which has undergone signal processing to the external host computer (not shown).

An instruction RAM 11 is a memory in which a control program for controlling these operations is stored. This program can be rewritten, for example, by an external unit. The instruction RAM 11 delivers programs for control of operations to respective circuit components within the acoustic signal processing unit 2, and delivers timing information to a timing generator 10 on the basis of the control program. The timing generator 10 generates a timing signal which controls system operation. This timing signal is delivered to respective circuit components within the acoustic signal processing unit 2.

Acoustic signal processing is carried out within the acoustic signal processing unit 2 on the basis of the timing signal. At this time, the multiplier/adder 41 for 44.1 kHz sampling and the multiplier/adder 40 for 22.05 kHz sampling carry out sampling at two different sampling frequencies of 44.1 kHz and 22.05 kHz respectively.

Special effect processing of the acoustic signal as described above is accomplished by the external special effect RAM 1 which is used to delay a signal by a predetermined time to add reverberant sound to a main sound (voice), such as, for example, to provide an echo. For this reason, because the reverberant sound is accompanied by the main sound (voice), it is satisfactory that the signal quality of the reverberant sound is not as high as that of main sound (voice). Accordingly, it is not necessary to perform sampling of main or primary sound (voice) and the reverberant sound at the same sampling frequency.

Nevertheless, in these conventional acoustic signal processing systems, in the case where main sound (voice) and reverberant sound are sampled at the same sampling frequency in order to sample the acoustic signal at a single sampling frequency, or in the case where sampling at two different two sampling frequencies is performed, because a pair of multiplier adders are respectively provided to independently carry out respective sampling operations, the efficiency of such a signal processing device is poor. Furthermore, these systems require additional hardware.

The present invention has been made in view of the above shortcomings of the prior art, and its object is to provide an acoustic signal processing method and apparatus which reduce the requirements of external special effect memory and simplify the hardware required for performing special effects processing.

SUMMARY OF THE INVENTION

The acoustic signal processing method and apparatus of the present invention is directed to processing acoustic signal at a sampling frequency fs as shown in FIGS. 1 to 3, wherein main voice (sound) processing is performed on an acoustic signal at the basic sampling frequency, fs within one period of the basic sampling frequency fs to allow the acoustic signal which has been subjected to the main voice processing to undergo down-sampling to implement acoustic special effect voice (sound) processing of the acoustic signal on the basis of another sampling frequency (½)fs in order to allow the acoustic signal which has been subjected to acoustic effect voice processing to undergo up-sampling.

The acoustic signal processing apparatus (unit) of the present invention comprises a timing signal generating means 10 which generates a timing signal for carrying out acoustic effect processing; and a single operation or processing means 6, 7 for implementing processing of the acoustic signal in the special (acoustic) effect memory 1. Processing is carried out on the basis of the timing signal generated by the timing signal generating means 10. In this system, main voice processing is performed on the acoustic signal at the basic sampling frequency fs within one period of the basic sampling frequency fs to allow the acoustic signal which has been subjected to main voice processing to undergo down-sampling to implement acoustic effect voice processing on the acoustic signal at another sampling frequency (½)fs to allow the acoustic signal which has been subjected to voice processing for acoustic effect to undergo up-sampling.

In the above-described method and apparatus, the above-mentioned second sampling frequency, (½)fs, is a frequency which is one half of the basic sampling frequency fs. In accordance with the acoustic signal processing method and apparatus of this invention, main voice processing on an acoustic signal is performed at a basic sampling frequency fs within one period of the basic sampling frequency fs to allow the main voice processing implemented acoustic signal to undergo down-sampling to implement voice processing for acoustic effect on the acoustic signal at another sampling frequency, (½)fs, in order to allow the acoustic effect voice processing to undergo up-sampling. Accordingly, the main voice (sound) processing at the basic sampling frequency fs and the voice (sound) processing for acoustic effect at another sampling frequency (½)fs are continuously carried out to thereby lessen data storage requirements for acoustic effect processing and thus to permit the capacity of the external memory 1 to be reduced. Additionally, there is no need to provide separate dedicated multiplier/adders for every sampling frequency. In the present invention, signal processing is accomplished by a single operation system (one multiplier/adder pair 6, 7). Thus, signal processing is performed more efficiently and the device is simplified.

Moreover, in accordance with the acoustic signal processing apparatus of the present invention, main voice processing is performed on an acoustic signal at a basic sampling frequency fs during one period of the basic sampling frequency fs to allow the main voice processing acoustic signal to undergo down-sampling for processing of the acoustic special effect an acoustic signal at a sampling frequency which is (½)fs or ½ the basic sampling frequency fs to allow the acoustic special effect voice processing implemented acoustic signal to undergo up-sampling. Accordingly, the required amount of acoustic special effect processing data is decreased and the capacity of the external memory can be reduced.

Further, in accordance with this invention, in the above-described acoustic signal processing method and apparatus, because the second sampling frequency (½)fs is a frequency which is one half of the basic sampling frequency fs, acoustic special effect processing data can be reduced to one half and the required capacity of the external memory 1 can be reduced to one half. Furthermore, there is no need to provide separate dedicated multiplier/adder pairs for all desired sampling frequencies. Signal processing can therefore be accomplished by a single multiplier/adder pair 6, 7. Thus, signal processing can be efficiently carried out and the device is simplified.

BRIEF DESCRIPTION OF THE DRAWINGS

FIG. 4 is a schematic block diagram which illustrates a conventional acoustic signal processing apparatus for processing at two different sampling frequencies.

DETAILED DESCRIPTION OF THE PREFERRED EMBODIMENTS

Figure 1:
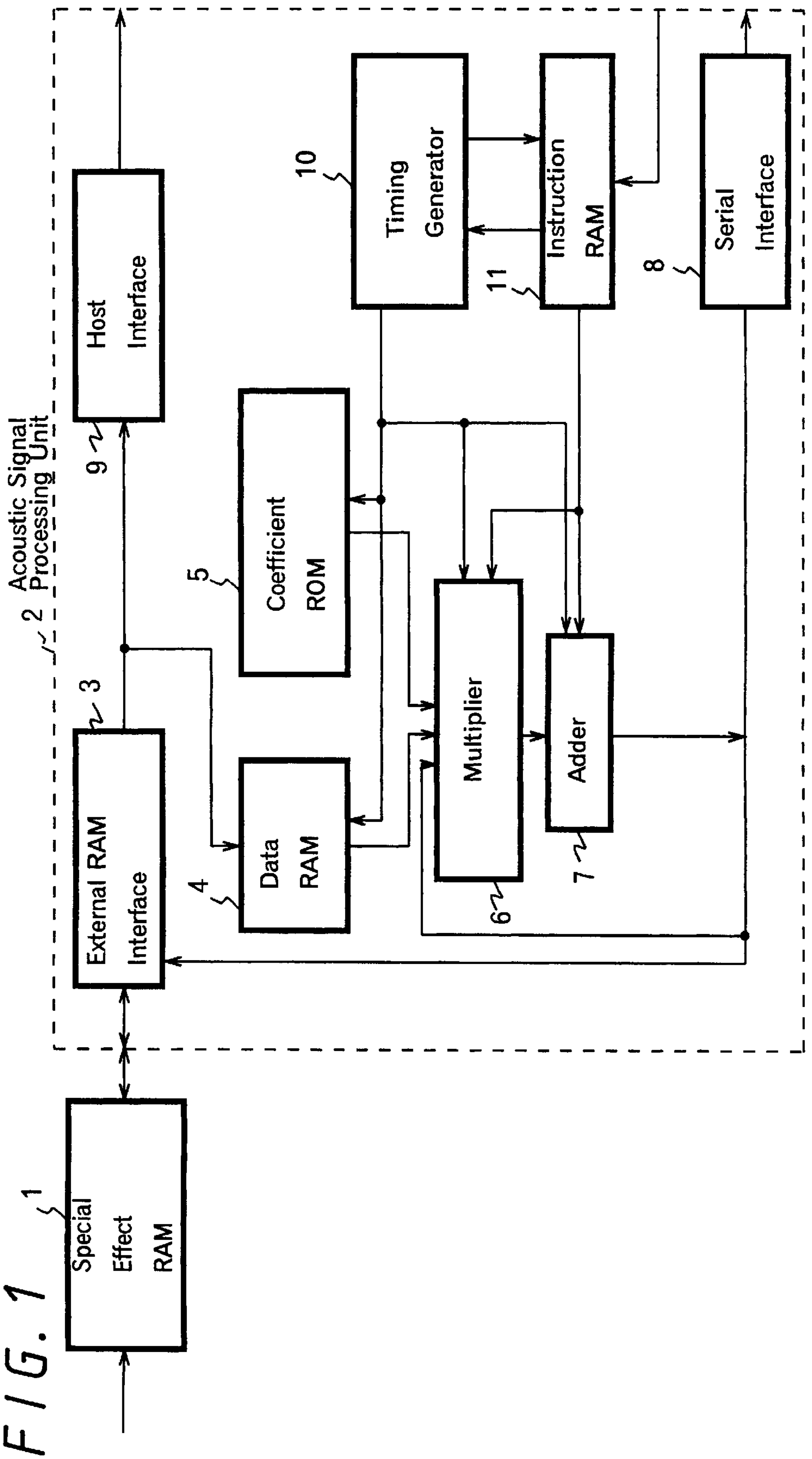
FIG. 1 is a schematic block diagram which illustrates a preferred embodiment of an acoustic signal processing apparatus which embodies the present invention.

A block diagram illustrating an embodiment of an acoustic signal processing apparatus which embodies the present invention is shown in FIG. 1. In FIG. 1, the same reference numerals are respectively attached to components corresponding to those shown in FIG. 4, and their detailed explanation is omitted. This embodiment is directed to a configuration for use in connection with a DSP (Digital Signal Processor) such as a hybrid IC in which circuits for performing a plurality of functions which carry out acoustic signal processing of acoustic signals for a CD are implemented in a single chip configuration.

In FIG. 1, an acoustic signal is delivered to the external special effect RAM 1. The acoustic signal which is to undergo special effect processing in the special effect RAM 1 is delivered to external RAM interface 3 within acoustic signal processing unit 2. The special effect RAM 1 and the acoustic signal processing unit 2 are connected through the external RAM interface 3. The acoustic signal delivered to the external RAM interface 3 is delivered to data RAM 4. The data RAM 4 delivers predetermined data to a multiplier 6 on the basis of the acoustic signal delivered thereto. The data which has undergone multiplication by the multiplier 6 is delivered to an adder 7. At this time, coefficient ROM 5 also delivers predetermined data for signal processing to the multiplier 6 and the adder 7.

The acoustic signal which has undergone signal processing by the multiplier 6 and the adder 7 is delivered to serial interface 8. The serial interface 8 delivers the acoustic signal which has undergone signal processing to the external devices for reproduction. A host interface 9 delivers the acoustic signal which has undergone signal processing to external host computer (not shown).

Instruction RAM 11 is a memory in which a control program for controlling these operations is stored. This program can be rewritten, for example, by an external unit. The instruction RAM 11 delivers programs for controlling operation of the respective circuit components within the acoustic signal processing unit 2, and delivers timing information to timing generator 10 on the basis of the control program stored in the instruction RAM 11. The timing generator 10 generates a timing signal on the basis of the timing program. This timing signal is delivered to respective circuit components within the acoustic signal processing unit 2. It is to be noted that the coefficient ROM 5 and the instruction RAM 11 may be comprised of either RAM or ROM.

Acoustic signal processing is carried out within the acoustic signal processing unit 2 on the basis of the timing signals. The multiplier 6 and the adder 7 in the operation section carry out processing operations at two different sampling frequencies 44.1 kHz and 22.05 kHz respectively within one period of the sampling frequency 44.1 kHz on the waveform data. In this case, the acoustic signal processing apparatus shown in FIG. 1 to which the acoustic signal processing method of this invention is applied differs from the conventional acoustic signal processing apparatus shown in FIG. 4 in the way of providing the timing signal and in that only a single operation means is employed consisting of single multiplier 6 and a single adder 7.

Figures 2A, 2B, 2C, 2D, 2E, 2F, 2G, 2H:
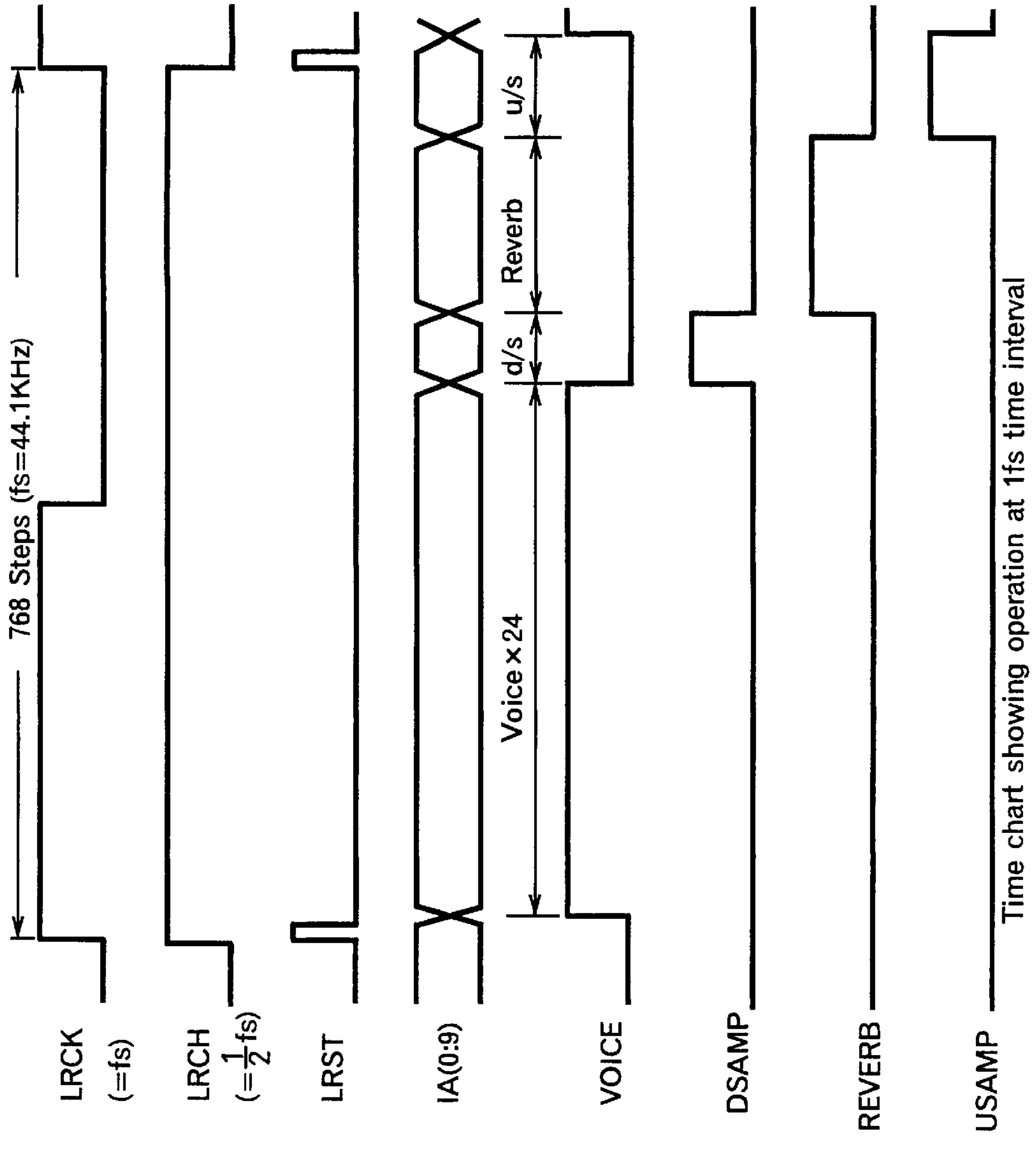
FIG. 2 is a timing chart which illustrates operation of audio signal processing of the present invention.

The timing chart of FIG. 2 illustrates operation during a ifs time interval for the embodiment of the acoustic signal processing method and the acoustic signal processing apparatus of the present invention. FIG. 2A indicates the LRCK signal of fs=44.1 kHz as the main sampling frequency. In this example, within one period of the LRCK signal, e.g., signal processing of 768 steps is carried out. It will be understood that the system operates at a clock speed of 33.868 MHZ. FIG. 2B indicates LRCH signal of (½)fs=22.05 kHz as the sampling frequency for processing of the acoustic effect signal. The LRCH signal has a period which is two times that of the LRCK signal. The LRCH signal can be generated by frequency-dividing the LRCK signal.

FIG. 2C illustrates pulse signals (LRST) which indicate the time interval of one period of the LRCK signal. The LRST signal can be generated, for example, by latching the rising edge of the LRCK signal. FIG. 2D illustrates the IA[0:9] instruction signal which indicates operation on the data of the acoustic signal within time interval of one period of the LRCK signal. The instruction signal consists of data of 10 bits from 0 to 9. FIG. 2E is a VOICE signal for allowing the instruction signal which indicates data of the acoustic signal to undergo main voice processing by fs=44.1 kHz as the main sampling frequency. By this VOICE signal, data of VOICE×24 of instruction signal is generated. VOICE×24 are prepared by synthesizing 24 different signals, for example, by processing with a synthesizer.

FIG. 2F is a DSAMP signal for down-sampling the acoustic signal. FIG. 2G is a reverb signal for providing the instruction signal to perform acoustic effect processing at a frequency of (½)fs=22.05 kHz for processing the acoustic effect signal. FIG. 2H is a USAMP signal for up-sampling the acoustic signal. By the USAMP signal, data is up-sampled.

Figures 3A, 3B, 3C:
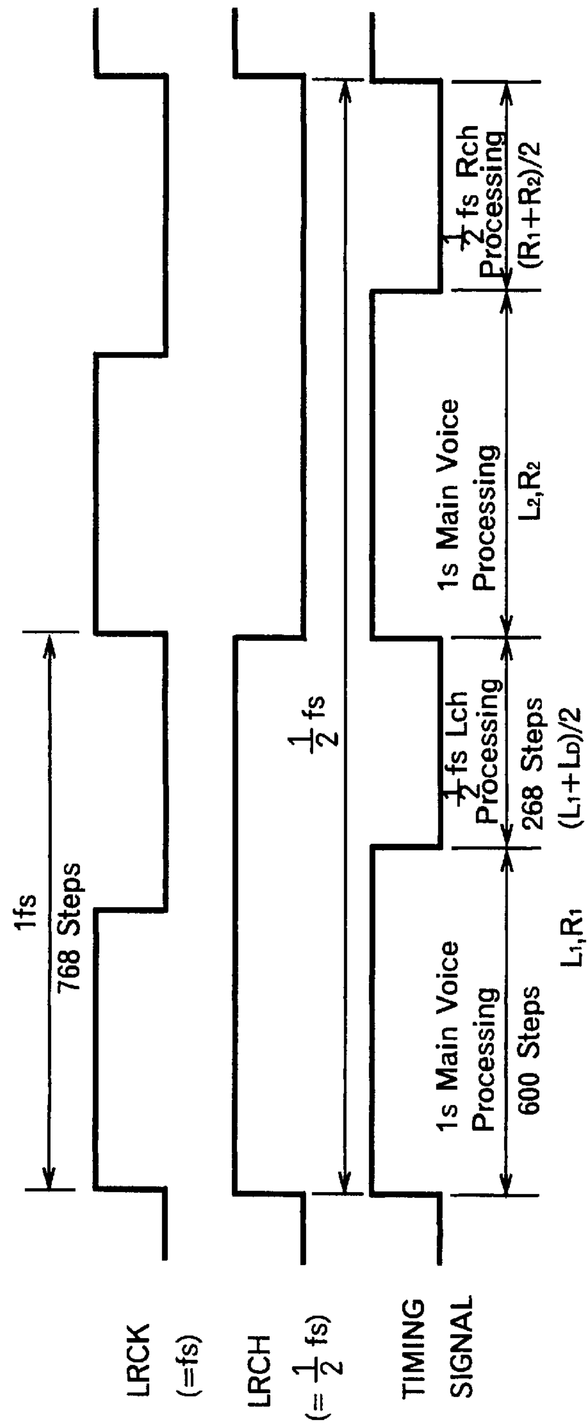
FIG. 3 is a timing chart which indicates system operation at time intervals of fs and (½)fs of the embodiment of the acoustic signal processing method and the acoustic signal processing apparatus of the present invention.

The timing chart indicates operation at the intervals of 1 fs and (½)fs of the embodiment of the acoustic signal processing method and the acoustic signal processing apparatus of the present invention. FIG. 3A shows the LRCK signal of fs=44.1 kHz as the main sampling frequency. FIG. 3B shows LRCH signal of (½)fs=22.05 kHz as the sampling frequency for processing of the acoustic special effect signal. FIG. 3C is a timing signal for operating the multiplier 6 and adder 7.

As shown in FIG. 3A, 1 fs consists of 768 steps and in FIG. 3C, the fs main voice processing consists of 500 steps and the (½)fsLch processing consists of 268 steps. At the next 768 steps of 1 fs, the fs main voice processing consists of 500 steps and the (½)fsRch processing consists of 268 steps. Processing based on such step assignment is repeated at periods subsequent thereto. Data for the left and right stereo channels, within 768 steps which is one period of 1 fs are assumed to be L1, R1, data. The data before and after are respectively indicated by L0, R0 and L2, R2.

At this time, in FIG. 3C, during the first 500 steps of the fs period of 768 steps, main voice processing on data L1 and R1 are carried out. During the subsequent 268 steps of the (½)fsLch processing, reverberation processing of (L1+L0)/2 is carried out. Two numeric data words for the left channel are averaged for the reverb processing. During the 500 steps of the fs main voice processing for data L2, R2 within the subsequent 768 steps which is one period of 1 fs, processing of L2, R2 is carried out. During the subsequent 268 steps of (½)fsRch processing, reverb processing of (R1+R2)/2 is carried out for the average valve of two successive data words for the right channel. Such processing is repeated at periods subsequent thereto. Thus during each sample period of 44.1 KHz the main data signal is processed for both left and right channels. Processing of the special effect signal for the left and right channel is performed during alternate sample periods. The average value of the previous and subsequent signal values is used for this calculation as shown.

In accordance with the above-described embodiment, it is possible to simultaneously execute a plurality of applications of sound source processing and special effect processing. Moreover, in accordance with the above-described embodiment, signal processing of the acoustic signal at two sampling frequencies with a single multiplier/adder combination 6, 7 within one IC chip is accomplished in a shared manner.

Further, in accordance with the above-described embodiment, since reverberation processing is conducted after down-sampling is carried out, the quantity of data for sampling by the reverberation processing can be reduced. Thus, the memory capacity of the external memory for special effect processing can be reduced.

In accordance with the above-described embodiment, during the period of the timing signal, for the fs main voice processing, it is possible to process the left channel Lch and right channel Rch acoustic signals within the same sampling period. Further, in accordance with the above-described embodiment, during the period of the timing signal, it is possible to discriminate between the reverberant signal of the left channel Lch and the reverberant signal of the right channel Rch in the (½)fs Lch processing or (½)fsRch processing.

Further, in accordance with the acoustic signal processing method and apparatus of the above-described embodiment, such an approach is employed to implement main voice processing on an acoustic signal at a basic sampling frequency fs within one period of the basic sampling frequency fs to allow the main voice acoustic signal to undergo down-sampling in order to implement voice processing for acoustic effect on the acoustic signal at another sampling frequency (½)fs or one-half the basic sampling frequency to allow the acoustic effect voice processing implemented acoustic signal to undergo up-sampling. Processing at the basic sampling frequency fs of the main sound and processing for acoustic special effect at a sampling frequency (½)fs or one half the basic sampling frequency are continuously carried out. This makes it possible to decrease the quantity of data for processing of acoustic effect. As a result, the capacity of the external memory 1 can be reduced. Furthermore, there is no need to provide a pair of multiplier/adders 6, 7 for every sampling frequency. As a result, signal processing can be accomplished with a single multiplier/adder pair 6, 7. Thus, signal processing can be efficiently carried out.

Further, in accordance with the above-described embodiment, because the second sampling frequency (½)fs is a frequency which is one half of the basic sampling frequency fs, the data required for acoustic special effect processing can be reduced to one half. Accordingly, the capacity of the external memory 1 can be reduced to one half. In addition, there is no need to provide separate pairs of multiplier/adders for every sampling frequency and signal processing cain be accomplished with a single multiplier and adder 6, 7. Thus, signal processing can be efficiently carried out.

While the acoustic signal processing of acoustic signal of a CD has been described in the above-described embodiment, it is needless to say that this invention may also be applied to other CD-I (interactive) or MO (Magneto-Optical discs), etc as well as other types of storage devices.

Because the system clock speed is far greater than the required sampling frequency, the single multiplier adder combination can perform sampling and processing of the acoustic signal at two different sampling frequencies. It is understood that a single multiplier/adder may perform processing of both left and right channels, or alternately two multiplier adder pairs may be used, one for each channel. In such a system, each pair would perform sampling at 44.1 KHz and 22.05 KHz for main and special effect processing respectively.

Although modifications and changes may be suggested by those skilled in the art, it is the intention of the inventors to embody within the patent warranted hereon all changes and modifications as reasonably and properly come within the scope of their contribution to the art.

We claim as our invention:

1. An acoustic signal processing method for implementing acoustic special effect processing on an acoustic signal comprising the steps of:

storing acoustic signal waveform data in a memory;

processing the acoustic signal at a first sampling frequency within one period of the first sampling frequency with a single multiplier/adder pair;

down-sampling the acoustic signal to provide a down-sampled signal;

sampling the down-sampled signal at a second sampling frequency with the single multiplier/adder pair to provide a resultant signal; and up-sampling the resultant signal.

2. An acoustic signal processing method as set forth in claim 1, wherein the second sampling frequency is one half of the first sampling frequency.

3. A method according to claim 1, wherein the step of down-sampling and up-sampling occur within a single period of the first sampling frequency.

4. A method of processing an acoustic signal comprising the steps of:

storing waveform data in a memory;

sampling the waveform data at a first frequency to provide first left and right channel main signals;

sampling the waveform data at a second frequency to provide a left channel special effect signal;

sampling the waveform data at the first frequency to provide second left and right channel main signals; and sampling the waveform data at the second frequency to provide a right channel special effect signal.

5. The method of claim 4, wherein the second frequency is 22.05 kHz and the first frequency is 44.1 kHz.

6. The method of claim 4, wherein the first left channel special effect signal is an average value of two waveform data values.

7. An acoustic signal processing device comprising:

a memory for storing acoustic signal waveform data;

a single multiplier/adder pair for processing the acoustic signal at a first sampling frequency within one period of the first sampling frequency;

a means for down-sampling the acoustic signal to provide a down-sampled signal;

a means for sampling the down-sampled signal at a second sampling frequency with the single multiplier/adder pair to provide a resultant signal; and means for up-sampling the resultant signal.

8. An acoustic signal processing device according to claim 7, wherein the second sampling frequency is one half of the first sampling frequency.

9. An acoustic signal process device according to claim 7, wherein the down-sampling and up-sampling occur within a single period of the first sampling frequency.

10. An acoustic signal processing device comprising:

a memory for storing waveform data;

means for sampling the waveform data at a first frequency to provide first left and right channel main signals;

means for sampling the waveform data at a second frequency to provide a left channel special effect signal;

means for sampling the waveform data at the first frequency to provide second left and right channel main signals; and means for sampling the waveform data at the second frequency to provide a right channel special effect signal.

11. The acoustic signal processing device of claim 10, wherein the second frequency is 22.05 kHz and the first frequency is 44.1 kHz.

12. The acoustic signal processing device of claim 10, wherein the first left channel special effect signal is an average value of two waveform data values.

* * * * *